United States Patent
Boerstler et al.

(10) Patent No.: US 7,200,064 B1
(45) Date of Patent: Apr. 3, 2007

(54) APPARATUS AND METHOD FOR PROVIDING A REPROGRAMMABLE ELECTRICALLY PROGRAMMABLE FUSE

(75) Inventors: David W. Boerstler, Round Rock, TX (US); Eskinder Hailu, Austin, TX (US); Subramanian Iyer, Mount Kisco, NY (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/246,586

(22) Filed: Oct. 7, 2005

(51) Int. Cl.
*G11C 7/00* (2006.01)

(52) U.S. Cl. ............................. 365/225.7; 365/189.01; 365/207

(58) Field of Classification Search ............ 365/225.7, 365/189.01, 207
See application file for complete search history.

(56) References Cited

U.S. PATENT DOCUMENTS

| | | | |
|---|---|---|---|
| 5,731,733 A | 3/1998 | Denham | |
| 5,789,970 A | 8/1998 | Denham | |
| 5,959,445 A | 9/1999 | Denham | |
| 6,567,333 B2 * | 5/2003 | Toda | ............ 365/225.7 |
| 6,693,481 B1 | 2/2004 | Zheng | |
| 2003/0218492 A1 | 11/2003 | Denham et al. | |
| 2004/0010436 A1 | 1/2004 | Fields | |

OTHER PUBLICATIONS

Krazit, Tom, "Electrical fuses help IBM chips heal themselves", InfoWorld, Aug. 2, 2004, http://www.infoworld.com/article/04/08/02/HNibmfuses_1.html?source=rss&url=http://w..., pp. 1-4.
"Self-Managing Semiconductors Physically Reconfigure Themselves", IBM Corporation, Press releases, Jul. 30, 2004, http://www1.ibm.com/press/PressServletForm.wss?MenuChoice=pressreleases&Templat..., pp. 1-2.
Cowan et al., "On-Chip Repair and an ATE Independent Fusing Methodology", IEEE, ITC International Test Conference, Paper 7.3, 2002, pp. 178-186.

* cited by examiner

*Primary Examiner*—David Lam
(74) *Attorney, Agent, or Firm*—Stephen J. Walder, Jr.; Diana R. Gerhardt (57) ABSTRACT

An apparatus and method for providing a reprogrammable electrically programmable fuse (eFuse) are provided. With the apparatus and method, a pair of eFuses are provided coupled to programming current sources and sensing current sources. When the pair of eFuses is to be programmed, a first programming current is applied to a first eFuse to thereby increase the resistance of the first eFuse by an incremental amount. When the pair of eFuses is to be returned to an unprogrammed state, a second programming current source is applied to a second eFuse to thereby increase a resistance of the second eFuse to be greater than the resistance of the first eFuse. When the sensing current is applied to the eFuses, a difference in the resulting voltages across the eFuses is identified and used to indicate whether the reprogrammable eFuse is in a programmed state or unprogrammed state.

35 Claims, 3 Drawing Sheets

| MODE | SWITCH SETTINGS (SW1,SWS1,SWP1,SW2,SWS2,SWP2) | R1 | R2 | eFuse OUTPUT |
|---|---|---|---|---|
| CALIBRATION | 1, 1, 0, 1, 1, 0 | R | R | 0 |
| PROGRAM (WRITE) | 1, 0, 1, 0, 0, 0 | R+δR | R | X |
| READ | 1, 1, 0, 1, 1, 0 | R+δR | R | 1 |
| PROGRAM (WRITE) | 0, 0, 0, 1, 0, 1 | R+δR | R+2*δR | X |
| READ | 1, 1, 0, 1, 1, 0 | R+δR | R+2*δR | 0 |

APPARATUS AND METHOD FOR PROVIDING A REPROGRAMMABLE ELECTRICALLY PROGRAMMABLE FUSE

BACKGROUND OF THE INVENTION

1. Technical Field

The present invention relates generally to an improved integrated circuit device. More specifically, the present invention is directed to an apparatus and method for providing a reprogrammable electrical programmable fuse (eFuse).

2. Description of Related Art

An electrical programmable fuse (eFuse) is a simple circuit element that has one of two different states: blown or unblown. As is generally known in the art, the writing of data to eFuses involves the blowing of eFuses to represent a "1" and the leaving of eFuses in their default state, i.e. unblown, to represent a "0" value. In the unblown state, the eFuse enables an electrical contact while in the blown state, the electrical contact is severed. However, the opposite approach may be taken in the case of, for example, inverse eFuses in which blowing of the eFuse actually enables an electrical contact thereby representing a "0" with the default state representing a "1."

Many integrated circuit chips available from International Business Machines, Inc., already include one or more banks of eFuses that are used to provide a self-repair ability to the integrated circuit chip. With eFuses, if an imperfection is detected in the integrated circuit, the appropriate eFuses are tripped, i.e. blown. The activated fuses help the chip control individual circuit speed to manage power consumption and repair unexpected, and potentially costly, flaws. If the technology detects that the chip is malfunctioning because individual circuits are running too fast or too slow, it can "throttle down" these circuits or speed them up by controlling appropriate local voltage. The eFuses are provided in the integrated circuit chips with little if any additional cost to the integrated circuit chips.

Figure 1:
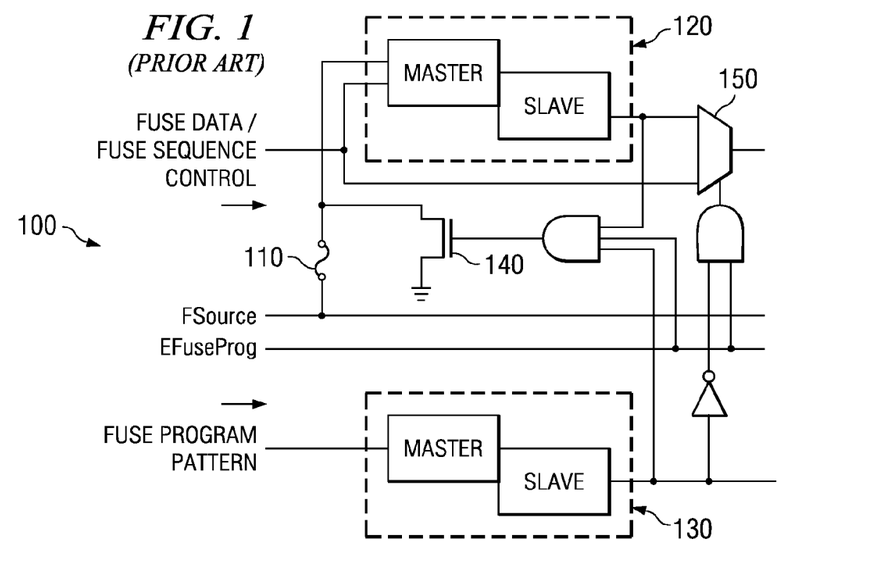
FIG. 1 is a diagram illustrating an electrically programmable fuse (eFuse) in accordance with the prior art.

FIG. 1 is a diagram of an eFuse in accordance with a known structure. As shown in FIG. 1, the eFuse element 100 consists of several components including a polysilicon fuse 110, a fuse latch 120, a program latch 130, a program field effect transistor (FET) 140, and a look-ahead programming multiplexer 150. The first, and primary component is the polysilicon fuse 110. The fuse 110 has two possible logic states. In the depicted example, it can remain intact where its value is evaluated as a logical "zero." The other state is "programmed" and evaluates to a logical "one." A DC current pulse of approximately 10 mA in amplitude and duration of 200 μsec is required to program the fuse 110. This high current programs the fuse 110 by dynamically increasing the resistance of the polysilicon link.

A fuse latch 120 is associated with each fuse 110. The fuse latch 120 serves three functions: (1) during fuse programming, all fuse latches 120 are initialized to a logical "zero," and then a single logical "one" is shifted through, providing a sequence enabling mechanism to determine when to program each fuse 110; (2) when reading the fuse values, the fuse latch 120 is used to sense and store the fuse value; and (3) the fuse latch has an additional data port, used to create a daisy chain between all fuses, which permits serial access to all fuses. Because of the high DC current requirements required to program a single fuse, a logical "one" is shifted through a field of zeros using the daisy chained state latches in order to program one fuse at a time.

The remaining components of the eFuse 100 are functional only when programming the fuse 110. The desired state of the fuse is shifted into the program latch 130. When a program latch 130 is loaded with a logical "one," it selects the program FET 140 and also disables the look-ahead programming multiplexer 150. The look-ahead programming multiplexer 150 causes the fuse latch's shifted "one" to skip over fuses which are not selected for programming, thereby saving fuse programming time.

For programming to occur, the EFuseProg signal is enabled and a high voltage is places across the fuse 110 using the FSource input and the resulting current is sunk through the program FET 140. Only when this high current path is enabled can the fuse be programmed. The program FET 140 is enabled when the program latch 130 is set and the shifted "one" arrives at the fuse latch 120. For more information regarding eFuses and the use of eFuses to perform on-chip repair, reference is made to Cowan et al., "On-Chip Repair and an ATE Independent Fusing Methodology," ITC International Test Conference, IEEE 2002, pages 178–186, which is hereby incorporated by reference.

As mentioned above, electrically programmable fuses have been used by International Business Machines, Inc. to replace metal and laser fuses to electrically program the operation settings on a circuit or fix the failed circuit on a chip. However, as is evident from the above description, the current eFuse technology utilizes the low-to-high change of the eFuse resistance as the manner by which the eFuse is programmed. In so doing, the eFuse can only be programmed once and cannot be reprogrammed.

Because of this limitation, eFuses, under the current technology, are not appropriate for use in applications where reprogrammability is required. For example, eFuses cannot be used in electrically erasable programmable read only memory (EEPROM) applications, which typically require that the EEPROM be written to, read, and erased in a reprogrammable manner.

SUMMARY OF THE INVENTION

In view of the above, it would be beneficial to have an electrically programmable fuse (eFuse) that may be reprogrammed after an initial programming of the eFuse. The present invention provides such a reprogrammable eFuse and a method for reprogramming such an eFuse.

With the present invention a programmable signal is obtained by sensing a differential signal (voltage or current) across two eFuses. The eFuses are treated as variable resistors with their values tunable from low to high by a current stress provided in fine granularity by a programming current source. The eFuses ideally have a linear resistance increase with time or stress current in order to provide better control of the programming of the eFuses.

During calibration, both eFuses in a pair of eFuses are calibrated to the same resistance value. In order to write to the pair of eFuses, a first programming current is applied to a first one of the two eFuses to thereby increase its resistance value by an incremental amount. This incremental amount is equal to the smallest resistance step the eFuse can be programmed to in a controllable manner and will be dependent upon the resistive properties of the materials used to form the fuse in the eFuse. As a result of this increase in resistance of one of the eFuses, a difference in voltage across the two eFuses is created. The difference is indicative of the first eFuse being in a programmed state.

After the programming, a smaller current source is used to generate the voltage difference between the two eFuses for sensing the logical value of the eFuse pair. A voltage difference indicating that the first eFuse has a greater voltage than the second eFuse is indicative of a programmed state of the first eFuse. In a preferred embodiment, the unprogrammed state of the first eFuse corresponds to a logical "zero" while the programmed state of the first eFuse corresponds to a logical "one."

In order to reset the logical value of the sensing amplifier to "zero," a subsequent write to the second eFuse is utilized. A greater programming current is applied to the second eFuse than the programming current applied to the first eFuse. As a result, when the greater programming current is applied to the second eFuse, the resistivity of the second eFuse is made higher than the resistivity of the first eFuse. Thus, when using the sense current to sense the voltage difference between the two eFuses, the second eFuse will have a higher voltage than the first eFuse resulting in a logical "zero" output.

Following the same procedure, the eFuses may then be rewritten to in the same manner as previously described. This process may be repeated as many times as possible before the eFuses reach a very high resistance value and further programming cannot be controlled properly.

In one exemplary embodiment of the present invention, a reprogrammable electrically programmable fuse (eFuse) is provided that comprises a first eFuse coupled to a first programming current source and a first sensing current source, and a second eFuse coupled to a second programming current source and a second sensing current source. Control logic may be provided that controls application of a first programming current from the first programming current source and a first sensing current from the first sensing current source to the first eFuse, and that controls application of a second programming current from the second programming current source and a second sensing current from the second sensing current source to the second eFuse. A sensing amplifier may further be provided, coupled to the first eFuse and second eFuse, which senses a difference in signal output of the first eFuse and signal output of the second eFuse.

The second programming current may be greater than the first programming current. The first programming current may increase a resistance of the first eFuse by an first incremental amount less than a maximum resistance of the first eFuse. The second programming current may increase a resistance of the second eFuse by a second incremental amount less than a maximum resistance of the second eFuse and greater than the first incremental amount. The first programming current and second programming current may be applicable to the first eFuse and second eFuse, respectively, a plurality of times to increase a resistance of the first eFuse and second eFuse a plurality of times until a maximum resistance of the first eFuse and second eFuse is reached The sensing amplifier may output a logical value based on the difference in signal output of the first eFuse and signal output of the second eFuse. The logical value may be a first value if the difference indicates that the first eFuse is in a programmed state, and may be a second value if the difference indicates that the first eFuse is in an unprogrammed state. Calibration logic may be provided that calibrates the sensing amplifier.

In addition to the above, a plurality of switches may be provided such that the control logic causes appropriate switches in the plurality of switches to open and close to control the application of the first programming current from the first programming current source and the first sensing current from the first sensing current source to the first eFuse. The control logic may further cause appropriate switches in the plurality of switches to open and close to control application of the second programming current from the second programming current source and the second sensing current from the second sensing current source to the first eFuse The reprogrammable eFuse may be part of an electrically erasable programmable read only memory circuit. The reprogrammable eFuse may further be part of a data processing device. This data processing device may an integrated circuit chip, a multi-chip package, a motherboard, a gaming console, a handheld computing device, portable computing device, or non-portable computing device, for example.

In a further embodiment of the present invention, a method of providing a reprogrammable electrically programmable fuse (eFuse) is provided. This method may comprise providing a first eFuse coupled to a first programming current source and a first sensing current source and providing a second eFuse coupled to a second programming current source and a second sensing current source. The method may further comprise providing control logic that controls application of a first programming current from the first programming current source and a first sensing current from the first sensing current source to the first eFuse, and that controls application of a second programming current from the second programming current source and a second sensing current from the second sensing current source to the first eFuse. The method may also comprise providing a sensing amplifier, coupled to the first eFuse and second eFuse, which senses a difference in signal output of the first eFuse and signal output of the second eFuse.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 2:
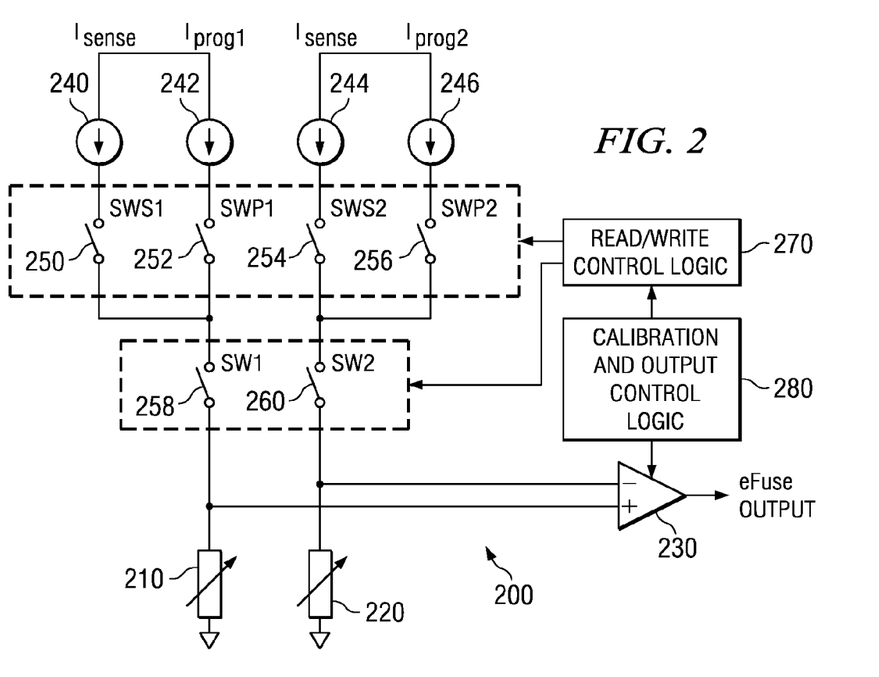
FIG. 2 is a diagram illustrating an exemplary circuit for providing a reprogrammable eFuse in accordance with an exemplary embodiment of the present invention.

FIG. 2 is a diagram illustrating an exemplary circuit for providing a reprogrammable eFuse in accordance with an exemplary embodiment of the present invention. As shown in FIG. 2, the circuit 200 includes a first eFuse 210 and a second eFuse 220 coupled to a sensing amplifier 230, and a plurality of current sources 240–246. The plurality of current sources 240–246 include a first sense current source 240, a first programming current source 242, a second sense current source 244, and a second programming current source 246.

The current sources 240–246 are coupled to the pair of eFuses 210 and 220 by way of signal lines and switches 250–260. The switches 250–260 include a first sensing switch 250, a first programming switch 252, a second sensing switch 254, a second programming switch 256, a first eFuse switch 258 and a second eFuse switch 260. The opening and close of switches 250–260 is controlled by read/write control logic 270. Calibration and output control logic 280 are provided for calibrating and controlling the output of sensing amplifier 230.

As is generally known, the resistance of an electric film or via increases after electromigration, which is the gradual displacement of metal atoms of a conductor as a result of current flowing through the conductor. The resistance increase is dependent upon the stress time, temperature, stress current, material of the conductor, and the conducting structure. The eFuse technology of the present invention uses electromigration to cause the resistance of the eFuse to incrementally increase from a low resistance value to a high resistance value.

With the present invention a programmable signal is obtained by sensing a differential signal (voltage or current) across the two eFuses 210 and 220. The eFuses are treated as variable resistors with their resistance values tunable from low to high by a current stress, e.g., $I_{prog1}$ and $I_{prog2}$ provided in fine granularity by a programming current source, e.g., first and second programming sources 242 and 246. The eFuses 210 and 220 may be formed from any suitable material including polysilicon, metal, or other materials typically available in a silicon integrated circuit formation process. Ideally, the eFuses 210 and 220 are formed of a material and construction that provides a linear resistance increase with time or stress current in order to provide better control of the programming of the eFuses.

Ideally, the initial value of the output of the sensing amplifier should not be either "0" or "1" but half of the voltage between power supply and ground if perfect matching exists between eFuse pair 210 and 220 and the switches and currents sources associated with them. However, process introduced variations can lead to mismatches for those components. As a result, the output of the sensing amplifier can be "1" or "0" initially. To compensate this offset, it is necessary to calibrate the sensing amplifier so that the sensing amplifier operates in its high gain region during read operations. By doing so, a minimal voltage difference and thus, resistance change, would be required to program a "1" or "0". Such calibration is performed under the control of calibration and output control logic 280.

After calibration, the eFuses 210 and 220 may then be written to. In order to write to the pair of eFuses 210 and 220 a first programming current, e.g., $I_{prog1}$, is applied to a first one of the two eFuses, e.g., eFuse 210, to thereby increase its resistance value by an incremental amount. This incremental amount is equal to the smallest resistance step the eFuse 210 can be programmed to in a controllable manner and will be dependent upon the resistive properties of the materials used to form the fuse in the eFuse 210. The writing of data to the eFuse 210 is controlled by the read/write control logic 270.

As a result of the increase in resistance of eFuse 210, a difference in voltage across the two eFuses 210 and 220 is created. The difference is indicative of the eFuse 210 being in a programmed state. That is, when a sensing current is applied across both eFuses 210 and 220, the voltage sensed at the sensing amplifier 230 will be greater for the eFuse 210 than for the eFuse 220 thereby creating a voltage difference across the two eFuses 210 and 220.

In order to reset the logical value of the first eFuse 210 to "zero," a subsequent write to the second eFuse 220 is utilized. A programming current is applied to the second eFuse 220 so that the resistivity of the second eFuse 220 is made higher than the resistivity of the first eFuse 210. Thus, when using the sense current $I_{sense}$ to sense the voltage difference between the two eFuses 210 and 220, the second eFuse 220 will have a higher voltage than the first eFuse 210 resulting in a logical "zero" output.

Following the same procedure, the eFuses 210 and 220 may then be rewritten to in the same manner as previously described. It should be noted that a subsequent recalibration of the sensing amplifier 230 is not necessary, i.e. calibration need only be performed once. The read and write process may be repeated as many times as possible before the eFuses 210 and 220 reach a very high resistance value and further programming cannot be controlled properly.

Figure 3:
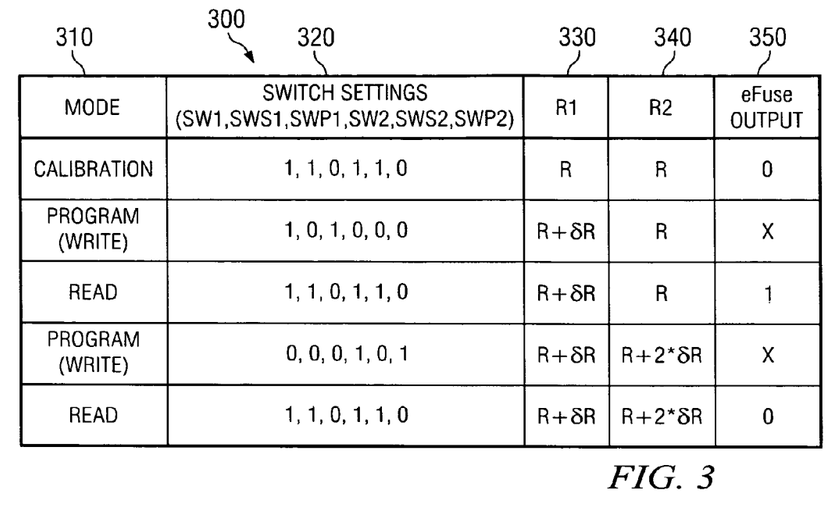
FIG. 3 is a table identifying the resistance values and corresponding eFuse output for the reprogrammable eFuse of FIG. 2 during programming, reading, and reprogramming in accordance with an exemplary embodiment of the present invention.

FIG. 3 is a table identifying the resistance values and corresponding eFuse output for the reprogrammable eFuse of FIG. 2 during programming, reading, and reprogramming in accordance with an exemplary embodiment of the present invention. As shown in FIG. 3, the table 300 includes a column 310 identifying the mode of operation of the eFuse pair, a column 320 identifying the state of the switches in the circuit shown in FIG. 2 (a "1" indicating that the switch is closed and a "0" indicating that the switch is opened), a column 330 identifying the resistance value of the first eFuse 210, a column 340 identifying the resistance value of the second eFuse 220, and a column 350 identifying the output of the sensing amplifier.

As shown in FIG. 3, during calibration, the smaller sensing current $I_{sense}$ is applied to the eFuses 210 and 220 by way of closing switches 250, 254, 258 and 260 and opening the other switches. The sensing amplifier 230 is calibrated under this configuration for optimal performance. During programming of the pair of eFuses 210 and 220, a first programming current, $I_{prog1}$, is applied to the eFuse 210 by way of closing switches 252 and 258. This results in the first eFuse 210 having a resistance value of R+δR and the second eFuse 220 having the original resistance value of R. Because the pair of eFuses are not being sensed, the output of the eFuse pair is not provided, i.e. an "X" value.

During a read operation, the sensing current $I_{sense}$ is applied to the eFuses 210 and 220 by closing switches 250, 254, 258 and 260 and opening the other switches. Since the resistance of eFuse 210 is δR greater than the resistance of eFuse 220, the voltage across eFuse 210 is greater than the voltage across eFuse 220. As a result, the output of the sensing amplifier 270 based on the outputs from the pair of eFuses is a logical "1."

Thereafter, a subsequent write to the second eFuse 220 is performed by closing switches 256 and 260 while the other switches are opened. As a result of the writing to the second eFuse 220, the resistance of first eFuse 210 is R+δR and the resistance of second eFuse 220 is R+2*δR. Thus, the resistance of the second eFuse 220 is greater than the resistance of the first eFuse 210. During a subsequent read operation, this difference in resistance results in a voltage difference across the eFuses 210 and 220 in which the voltage across first eFuse 210 is less than the voltage across second eFuse 220. As a result, the output of the eFuse pair is a logical "0."

This same process of writing to eFuse pairs alternatively may be repeated with the resistance values of the eFuses continuing to incrementally increase until a threshold resistance is achieved where no further programming is possible. The subsequent write to the first eFuse 210 must result in a change in resistance that is greater than δR in order to ensure that a difference in resistance value between the eFuses 210 and 220 is maintained and thus, a voltage difference indicative of the first eFuse 210 being programmed is detected by the sensing amplifier 230. Since the resistance of the eFuse is proportional to the stress applied, which is the product of the current and the amount of time the current is applied, the change in resistance of the eFuse 210 may be achieved by either controlling the current source, via read/write control logic 270 for example, to provide a higher current or alternatively, by increasing the amount of time that the current is applied to the eFuse 210.

In one exemplary embodiment, the first time eFuse 210 is written to, the current source is control so that a change in resistance of δR is achieved in the eFuse 210. In all subsequent writes to both the eFuse 210 and the eFuse 220, the current sources are controls such that a change in resistance of 2*δR is obtained. This ensures that there will always be some difference in resistance and thus, output voltage, between the eFuses 210 and 220. In this way, a reprogrammable eFuse is obtained.

Figure 4:
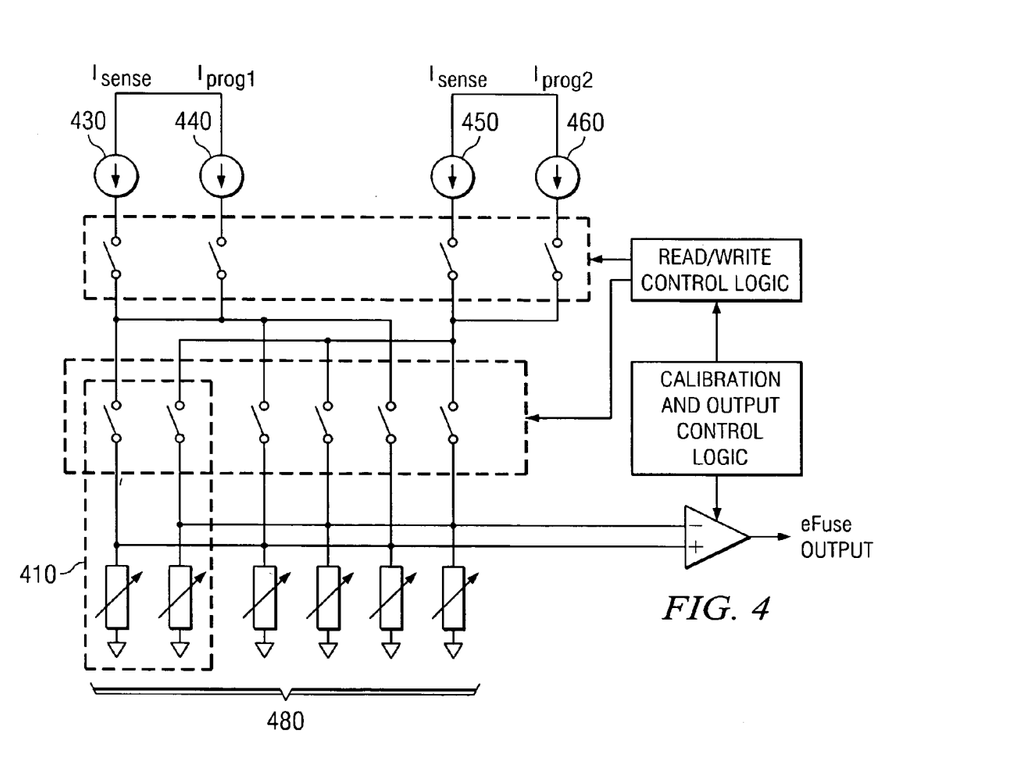
FIG. 4 is an exemplary diagram illustrating an exemplary circuit for utilizing the reprogrammable eFuse of the present invention in an EEPROM application configuration.

FIG. 4 is an exemplary diagram illustrating an exemplary circuit for utilizing the reprogrammable eFuse of the present invention in an EEPROM application configuration. As shown in FIG. 4, a series 480 of eFuse pairs 410 and corresponding switches 420 are provided and signal lines are provided to respective ones of the eFuses in each eFuse pair from current sources 430–460. By providing a series 480 of eFuse pairs 410, an electrically erasable programmable ROM device is made possible using reprogrammable eFuses in accordance with the present invention.

Figure 5:
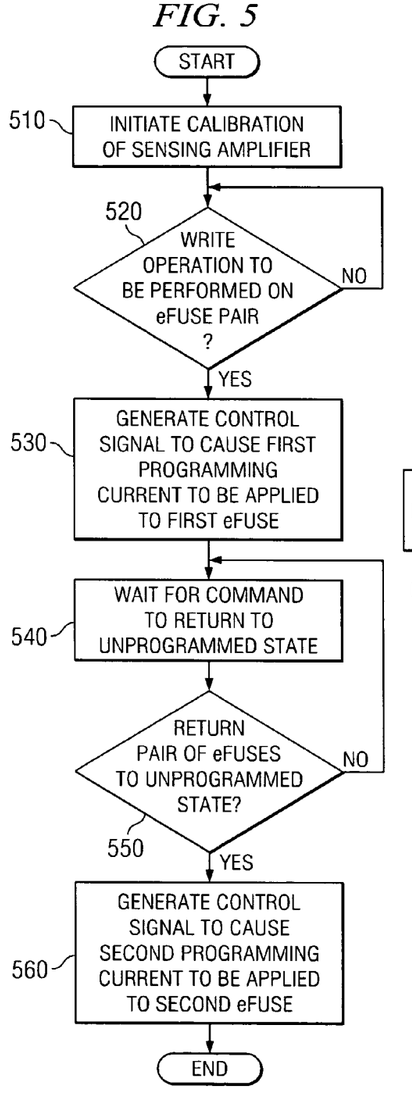
FIG. 5 is a flowchart outlining an exemplary operation of the present invention when writing and erasing a reprogrammable eFuse pair in accordance with an exemplary embodiment of the present invention.
Figure 6:
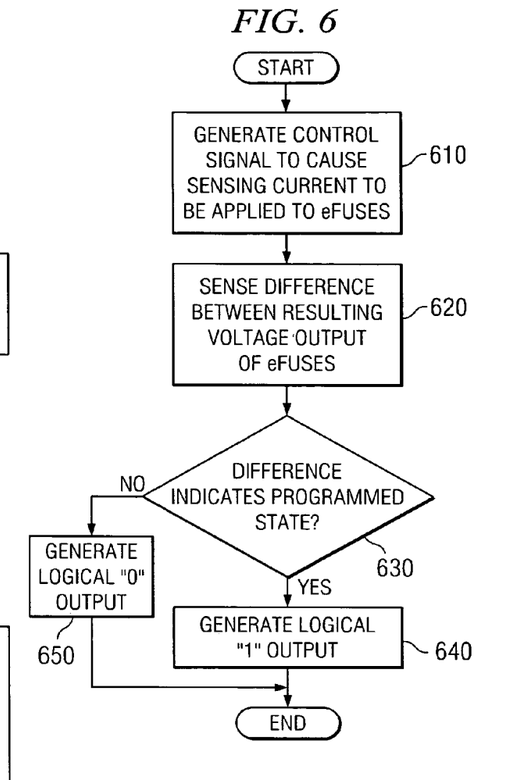
FIG. 6 is a flowchart outlining an exemplary operation of the present invention when reading logical output values from a reprogrammable pair of eFuses in accordance with an exemplary embodiment of the present invention.

FIGS. 5–6 are flowcharts outlining exemplary operations of the present invention for writing to, reading from, and reprogramming a reprogrammable eFuse in accordance with an exemplary embodiment of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

FIG. 5 is a flowchart outlining an exemplary operation of the present invention when writing and erasing a reprogrammable eFuse pair in accordance with an exemplary embodiment of the present invention. The operation shown in FIG. 5 may be performed, for example, by control logic in an integrated circuit having a reprogrammable eFuse pair, for example.

As shown in FIG. 5, the operation starts by initiating calibration of the sensing amplifier (step 510). At some time after the calibration, a determination is made as to whether a write operation is to be performed to the pair of eFuses (step 520). This determination may be made based on whether or not a write signal is received in the control logic, for example.

A control signal is generated to cause a first programming current to be applied to a first eFuse of the pair of eFuses to thereby increase its resistance (step 530). This control signal may be, for example, a signal that controls switches in the integrated circuit to thereby open and close appropriate switches to apply the first programming current to the first eFuse. This writing to the first eFuse results in a difference in resistance values between the first and second eFuses of the pair of eFuses and thus, a difference in any sensed voltages/currents across these eFuses. This results in a programmed result, e.g., a logical "1", being output by the pair of eFuses.

The operation then waits for a command to return the pair of eFuses to an unprogrammed state (step 540). A determination is made as to whether the pair of eFuses is to be returned to an unprogrammed state, i.e. a logical "0" output (step 550). If not, the operation returns to step 540 and continues to wait. If the pair of eFuses is to be returned to an unprogrammed state, a control signal is generated to cause a second programming current to be applied to the second eFuse in the pair of eFuses (step 560). This control signal may be, for example, a signal that controls switches in the integrated circuit to thereby open and close appropriate switches to apply the second programming current to the second eFuse. This second applied programming current results in either a resistance value of the second eFuse that is greater than the resistance value of the first eFuse, thereby resulting in a logical "0" output from the pair of eFuses. The operation then ends.

It should be appreciated that the operation outlined in FIG. 5 above may be repeated each time programming of the reprogrammable eFuse pair is desired. However, calibration of the sensing amplifier is only required once. With subsequent writes to the eFuse pair to program the eFuse pair, the current and/or duration of application of the current may be modified so as to achieve voltage differences between the eFuses of the eFuse pair. Thus, the first write to the eFuse pair may make use of a first current and duration, while all subsequent writes to the eFuse pair may make use of a second current and/or duration. Moreover, this operation may be performed for each reprogrammable eFuse pair provided in the system or apparatus. Thus, the above operation shown in FIG. 5 may be repeated many times within the same integrated circuit device.

FIG. 6 is a flowchart outlining an exemplary operation of the present invention when reading logical output values from a reprogrammable pair of eFuses in accordance with an exemplary embodiment of the present invention. The operation shown in FIG. 6 may be performed by control logic provided in the integrated circuit having a pair of reprogrammable eFuses in accordance with the present invention, for example.

As shown in FIG. 6, the operation starts by generating a control signal to cause a sensing current to be applied to the pair of eFuses (step 610). This control signal may be, for example, a control signal that causes appropriate switches in the integrated circuit to open and close to thereby apply the sensing current to the first and second eFuses in the pair of eFuses. A difference between the resulting voltage output of the eFuses is sensed (step 620). A determination is made as to whether the difference indicates a programming state of the pair of eFuses (step 630). If so, then an output of the pair of eFuses is set to a logical "1" value (step 640). If not, then an output of the pair of eFuses is set to a logical "0" value (step 650). The operation then terminates.

Thus, the present invention provides a reprogrammable eFuse apparatus. The mechanism of the present invention may be used in any application where reprogrammability of a persistent storage device is desirable. For example, one possible application of the present invention is as an EEPROM type device. It can also provide a multiple self-_repairing ability to an integrated circuit.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to gaming consoles, handheld or portable computing devices, and other advanced non-portable computer products having a display, a keyboard or other input device, and a central processor.

Figure 7:
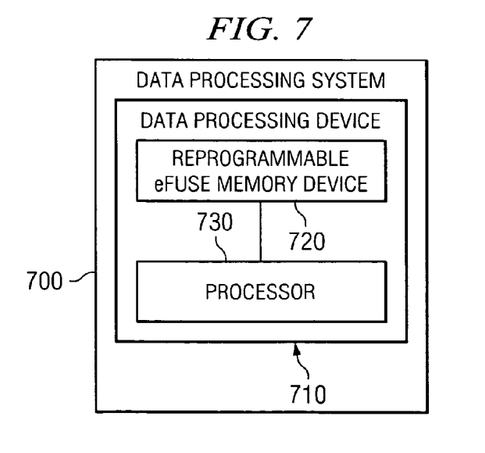
FIG. 7 is an exemplary block diagram illustrating a data processing device in which a reprogrammable e-Fuse memory device of the present invention may be implemented.

FIG. 7 is an exemplary block diagram illustrating a data processing device in which a reprogrammable e-Fuse memory device of the present invention may be implemented. As shown in FIG. 7, the reprogrammable e-Fuse memory device 720 is provided on or in a data processing device 710 in association with a processor 730. It should be noted that while the data processing device 710 is illustrated as having a single reprogrammable e-Fuse memory device 720 coupled to the processor 730, the present invention is not limited to such. Rather, multiple reprogrammable e-Fuse memory devices 720 may be provided in association with one or more processors 730 in the data processing device 710 in accordance with the present invention. These reprogrammable e-Fuse memory devices 720 may be provided as EEPROM type devices, non-volatile random access memory devices, or the like.

As mentioned above, the data processing device 710 may be any of a number of different types of data processing devices. Such data processing devices include, but are not limited to, integrated circuit chips, multi-chip packages, motherboards, and the like. The data processing device 710 may be part of a larger data processing system or device 700. This larger data processing system or device 700 may be any type of device utilizing a data processing device 710 ranging from toys and other low-end applications to gaming consoles, handheld or portable computing devices, and other advanced non-portable computing devices, such as desktop computers, servers, or the like.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A reprogrammable electrically programmable fuse (eFuse), comprising:
    a first eFuse coupled to a first programming current source and a first sensing current source;
    a second eFuse coupled to a second programming current source and a second sensing current source;
    control logic that controls application of a first programming current from the first programming current source and a first sensing current from the first sensing current source to the first eFuse, and that controls application of a second programming current from the second programming current source and a second sensing current from the second sensing current source to the second eFuse; and
    a sensing amplifier, coupled to the first eFuse and second eFuse, which senses a difference in signal output of the first eFuse and signal output of the second eFuse.

2. The reprogrammable eFuse of claim 1, wherein the sensing amplifier outputs a logical value based on the difference in signal output of the first eFuse and signal output of the second eFuse.

3. The reprogrammable eFuse of claim 2, wherein the logical value is a first value if the difference indicates that the first eFuse is in a programmed state, and is a second value if the difference indicates that the first eFuse is in an unprogrammed stated.

4. The reprogrammable eFuse of claim 1, wherein the second programming current is greater than the first programming current.

5. The reprogrammable eFuse of claim 1, wherein the first programming current increases a resistance of the first eFuse by an first incremental amount less than a maximum resistance of the first eFuse.

6. The reprogrammable eFuse of claim 5, wherein the second programming current increases a resistance of the second eFuse by a second incremental amount less than a maximum resistance of the second eFuse and greater than the first incremental amount.

7. The reprogrammable eFuse of claim 1, wherein the first programming current and second programming current are applicable to the first eFuse and second eFuse, respectively, a plurality of times to increase a resistance of the first eFuse and second eFuse a plurality of times until a maximum resistance of the first eFuse and second eFuse is reached.

8. The reprogrammable eFuse of claim 1, wherein the reprogrammable eFuse is part of an electrically erasable programmable read only memory circuit.

9. The reprogrammable eFuse of claim 1, further comprising:
a plurality of switches, wherein the control logic causes appropriate switches in the plurality of switches to open and close to control the application of the first programming current from the first programming current source and the first sensing current from the first sensing current source to the first eFuse, and wherein the control logic causes appropriate switches in the plurality of switches to open and close to control application of the second programming current from the second programming current source and the second sensing current from the second sensing current source to the first eFuse.

10. The reprogrammable eFuse of claim 1, further comprising:
calibration logic that calibrates the sensing amplifier.

11. A method of providing a reprogrammable electrically programmable fuse (eFuse), comprising:
providing a first eFuse coupled to a first programming current source and a first sensing current source;
providing a second eFuse coupled to a second programming current source and a second sensing current source;
providing control logic that controls application of a first programming current from the first programming current source and a first sensing current from the first sensing current source to the first eFuse, and that controls application of a second programming current from the second programming current source and a second sensing current from the second sensing current source to the first eFuse; and
providing a sensing amplifier, coupled to the first eFuse and second eFuse, which senses a difference in signal output of the first eFuse and signal output of the second eFuse.

12. The method of claim 11, further comprising:
configuring the sensing amplifier to output a logical value based on the difference in signal output of the first eFuse and signal output of the second eFuse.

13. The method of claim 12, wherein the sensing amplifier is configured to output a logical value that is a first value if the difference indicates that the first eFuse is in a programmed state, and to output a second value if the difference indicates that the first eFuse is in an unprogrammed stated.

14. The method of claim 11, wherein the second programming current is greater than the first programming current.

15. The method of claim 11, wherein the first programming current is configured such that the first programming current increases a resistance of the first eFuse by an first incremental amount less than a maximum resistance of the first eFuse.

16. The method of claim 15, wherein the second programming current is configured such that the second programming current increases a resistance of the second eFuse by a second incremental amount less than a maximum resistance of the second eFuse and greater than the first incremental amount.

17. The method of claim 11, wherein the first programming current and second programming current are applicable to the first eFuse and second eFuse, respectively, a plurality of times to increase a resistance of the first eFuse and second eFuse a plurality of times until a maximum resistance of the first eFuse and second eFuse is reached.

18. The method of claim 11, further comprising:
providing the reprogrammable eFuse as part of an electrically erasable programmable read only memory circuit.

19. The method of claim 11, further comprising:
providing a plurality of switches, wherein the control logic causes appropriate switches in the plurality of switches to open and close to control the application of the first programming current from the first programming current source and the first sensing current from the first sensing current source to the first eFuse, and wherein the control logic causes appropriate switches in the plurality of switches to open and close to control application of the second programming current from the second programming current source and the second sensing current from the second sensing current source to the first eFuse.

20. The method of claim 11, further comprising:
providing calibration logic that calibrates the sensing amplifier.

21. A data processing device, comprising:
a processor; and
a reprogrammable memory coupled to the processor, wherein the reprogrammable memory comprises one or more reprogrammable electrically programmable fuses (eFuses), each reprogrammable eFuse in the one or more reprogrammable eFuses comprising:
a first eFuse coupled to a first programming current source and a first sensing current source; and
a second eFuse coupled to a second programming current source and a second sensing current source,
and wherein the reprogrammable memory further comprises control logic that controls application of a first programming current from the first programming current source and a first sensing current from the first sensing current source to the first eFuse of each of the one or more reprogrammable eFuses, and that controls application of a second programming current from the second programming current source and a second sensing current from the second sensing current source to the second eFuse of each of the one or more reprogrammable eFuses.

22. The data processing device of claim 21, wherein the data processing device is a motherboard.

23. The data processing device of claim 21, wherein the data processing device is an integrated circuit chip.

24. The data processing device of claim 21, wherein the data processing device is a multi-chip package.

25. The data processing device of claim 21, wherein the reprogrammable memory further comprises:
  a sensing amplifier, coupled to the first eFuse and second eFuse of each of the one or more reprogrammable eFuses, and which senses a difference in signal output of the first eFuse and signal output of the second eFuse of each of the one or more reprogrammable eFuses.

26. The data processing device 25, wherein the sensing amplifier outputs a logical value based on the difference in signal output of the first eFuse and signal output of the second eFuse of each of the one or more reprogrammable eFuses.

27. The data processing device of claim 26, wherein the logical value is a first value if the difference indicates that the first eFuse is in a programmed state, and is a second value if the difference indicates that the first eFuse is in an unprogrammed stated.

28. The data processing device of claim 25, wherein the reprogrammable memory further comprises:
  calibration logic that calibrates the sensing amplifier.

29. The data processing device of claim 25, wherein the data processing device is one of an integrated circuit chip, a multi-chip package, a motherboard, a gaming console, a handheld computing device, portable computing device, or non-portable computing device.

30. The data processing device of claim 21, wherein the second programming current is greater than the first programming current.

31. The data processing device of claim 21, wherein the first programming current increases a resistance of the first eFuse by an first incremental amount less than a maximum resistance of the first eFuse.

32. The data processing device of claim 31, wherein the second programming current increases a resistance of the second eFuse by a second incremental amount less than a maximum resistance of the second eFuse and greater than the first incremental amount.

33. The data processing device of claim 21, wherein the first programming current and second programming current are applicable to the first eFuse and second eFuse, respectively, a plurality of times to increase a resistance of the first eFuse and second eFuse a plurality of times until a maximum resistance of the first eFuse and second eFuse is reached.

34. The data processing device of claim 21, wherein the reprogrammable memory is an electrically erasable programmable read only memory.

35. The data processing device claim 21, wherein the reprogrammable memory further comprises:
  a plurality of switches, wherein the control logic causes appropriate switches in the plurality of switches to open and close to control the application of the first programming current from the first programming current source and the first sensing current from the first sensing current source to the first eFuse of each of the one or more reprogrammable eFuses, and wherein the control logic causes appropriate switches in the plurality of switches to open and close to control application of the second programming current from the second programming current source and the second sensing current from the second sensing current source to the second eFuse of each of the one or more reprogrammable eFuses.

* * * * *